(12) United States Patent
Yu et al.

(10) Patent No.: US 8,710,660 B2
(45) Date of Patent: Apr. 29, 2014

(54) HYBRID INTERCONNECT SCHEME INCLUDING ALUMINUM METAL LINE IN LOW-K DIELECTRIC

(75) Inventors: Chen-Hua Yu, Hsin-Chu (TW); Tien-I Bao, Dayuan Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/554,817

(22) Filed: Jul. 20, 2012

(65) Prior Publication Data

US 2014/0021614 A1  Jan. 23, 2014

(51) Int. Cl.
*H01L 23/52* (2006.01)
*H01L 21/768* (2006.01)

(52) U.S. Cl.
USPC .............. 257/751; 257/E23.141; 257/E23.01; 257/E23.151; 257/E21.584; 257/E21.002; 257/773; 257/752; 257/753; 257/762; 257/763; 257/767

(58) Field of Classification Search
USPC ............ 257/773, 758, E23.01, 751, 752, 753, 257/762, 763, 767, E21.002, E23.151, 257/E23.141, E21.584
See application file for complete search history.

(56) References Cited

U.S. PATENT DOCUMENTS

| | | | | |
|---|---|---|---|---|
| 6,077,774 A * | 6/2000 | Hong et al. | .................... | 438/643 |
| 6,331,481 B1 * | 12/2001 | Stamper et al. | ............... | 438/626 |
| 7,564,136 B2 * | 7/2009 | Yeh et al. | ...................... | 257/773 |
| 2005/0029010 A1 | 2/2005 | Ahn et al. | | |
| 2008/0014739 A1 * | 1/2008 | Matz et al. | .................... | 438/622 |
| 2008/0096380 A1 * | 4/2008 | Ko et al. | ....................... | 438/622 |
| 2009/0017563 A1 * | 1/2009 | Jiang et al. | ...................... | 438/4 |
| 2009/0140431 A1 * | 6/2009 | Feustel et al. | ................. | 257/758 |
| 2010/0032845 A1 * | 2/2010 | Usami | ........................... | 257/773 |
| 2010/0221911 A1 * | 9/2010 | Aubel et al. | ................. | 438/643 |
| 2012/0083115 A1 * | 4/2012 | Usami | ........................... | 438/637 |
| 2012/0111825 A1 * | 5/2012 | Chanda et al. | .................. | 216/17 |
| 2013/0069233 A1 * | 3/2013 | Chou et al. | .................... | 257/751 |
| 2013/0127055 A1 * | 5/2013 | Chen et al. | .................... | 257/751 |

FOREIGN PATENT DOCUMENTS

KR   20050015190   2/2005
KR   20050066823   6/2005

* cited by examiner

*Primary Examiner* — Alexander Oscar Williams
(74) *Attorney, Agent, or Firm* — Slater & Matsil, L.L.P.

(57) ABSTRACT

A device includes a first low-k dielectric layer, and a copper-containing via in the first low-k dielectric layer. The device further includes a second low-k dielectric layer over the first low-k dielectric layer, and an aluminum-containing metal line over and electrically coupled to the copper-containing via. The aluminum-containing metal line is in the second low-k dielectric layer.

20 Claims, 11 Drawing Sheets

HYBRID INTERCONNECT SCHEME INCLUDING ALUMINUM METAL LINE IN LOW-K DIELECTRIC

BACKGROUND

Modern integrated circuits are made up of transistors, capacitors, and other devices that are formed on semiconductor substrates. On a substrate, these devices are initially isolated from one another but are later interconnected together to form functional circuits. Typical interconnect structures include lateral interconnections, such as metal lines (wirings), and vertical interconnects, such as vias and contacts. The quality of the interconnect structure affects the performance and the reliability of the fabricated circuit. Interconnections are increasingly determining the limits of performance and density of modern integrated circuits.

The interconnect structures may include tungsten plugs and aluminum lines. In newer generations of the integrated circuits, dual damascene structures, which include copper lines and vias formed using dual damascene processes, were also used to form the interconnect structures.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

An interconnect structure and the method of forming the same are provided in accordance with various exemplary embodiments. The intermediate stages of forming the interconnect structure are illustrated. The variations of the embodiments are discussed. Throughout the various views and illustrative embodiments, like reference numbers are used to designate like elements.

Figure 1:
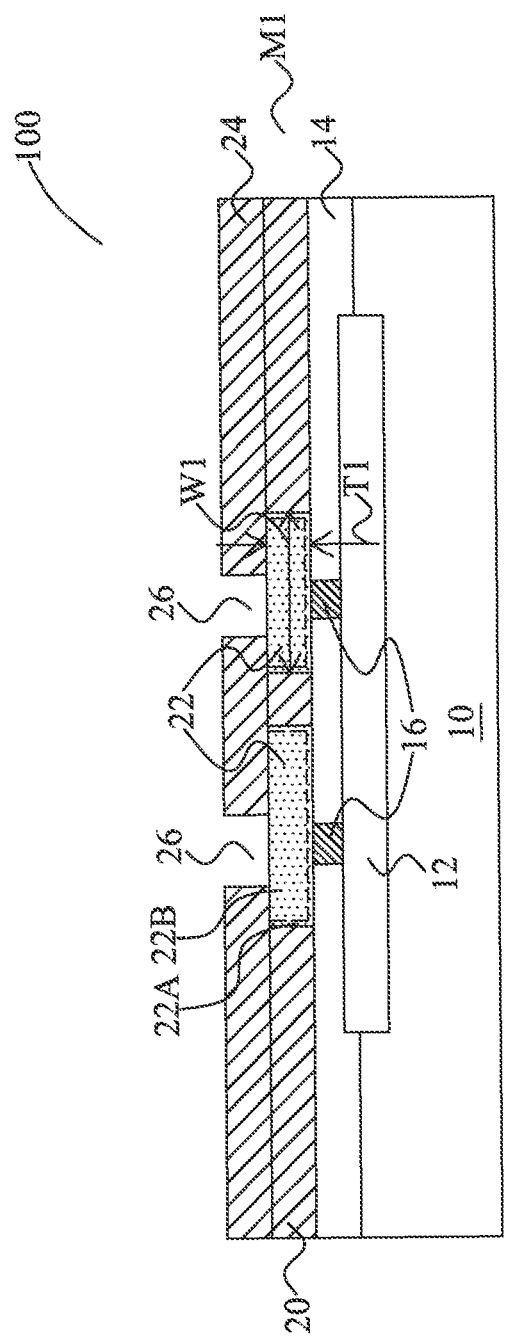
FIGS. 1 through 11 are cross-sectional views of intermediate stages in the manufacturing of an interconnect structure in accordance with some exemplary embodiments.

FIG. 1 illustrates wafer 100, which includes semiconductor substrate 10. Semiconductor substrate 10 may be formed of silicon, germanium, silicon germanium, III-V compound semiconductor, or the like. Active and passive devices 12, such as transistors, capacitors, resistors, and the like, may be formed adjacent to the top surface of semiconductor substrate 10.

FIG. 1 also illustrates the formation of Inter-Layer Dielectric (ILD) 14 and contact plugs 16. ILD 14 may be formed using Phospho-Silicate Glass (PSG), Boro-Silicate Glass (BSG), Boron-Doped Phospho-Silicate Glass (BPSG), Tetraethyl Orthosilicate (TEOS) oxide, or the like. Contact plugs 16, which may comprise tungsten, may be formed in ILD 14, and connected to devices 12. Dielectric layer 20 is formed over ILD 14. Dielectric layer 20 is alternatively referred to as an Inter-Metal Dielectric (IMD) layer. In some embodiments, IMD layer 20 comprises a low-k dielectric material, which has a dielectric constant (k value) lower than 3.9. The k value of IMD layer 20 may also be lower than about 3.0, or lower than about 2.5.

Metal lines 22 are formed in IMD layer 20. Throughout the description, the metal lines in an IMD layer are collectively referred to as a metal layer. Accordingly, metal lines 22 are in bottom metal layer M1. Metal lines 22 may be formed using a single damascene process, which is similar to the process shown in FIGS. 1 and 2. In some embodiments, metal lines 22 are formed by depositing and etching an aluminum-containing layer (such as AlCu), and patterning the aluminum-containing layer. In alternative embodiments, metal lines 22 are formed using a single damascene process, and hence may include barrier layer 22A, and copper-containing layer 22B over barrier layer 22A. Barrier layer 22A may include titanium, titanium nitride, tantalum, tantalum nitride, or other alternatives. Metal lines 22 may have thickness T1 between about 10 nm and about 50 nm, and width W1 between about 8 nm and about 30 nm, for example.

Referring again to FIG. 1, IMD layer 24 is formed over IMD 20. In some embodiments, IMD layer 24 has a dielectric constant (k value) lower than about 3.5, hence is referred to as low-k IMD layer 24 throughout the description. The k value of low-k IMD layer 24 may also be lower than about 2.8. In some embodiments, low-k IMD layer 24 includes oxygen, silicon, nitrogen, and the like. The exemplary materials include carbon-containing materials, organo-silicate glass, porogen-containing materials, and the like. Pores may be formed in low-k IMD layer 24 for lowering its k value. Low-k IMD layer 24 may be deposited using a CVD method such as Plasma Enhanced CVD (PECVD), although other deposition methods such as Low Pressure CVD (LPCVD), Atomic Layer CVD (ALCVD), and spin-on can also be used.

Figure 2:
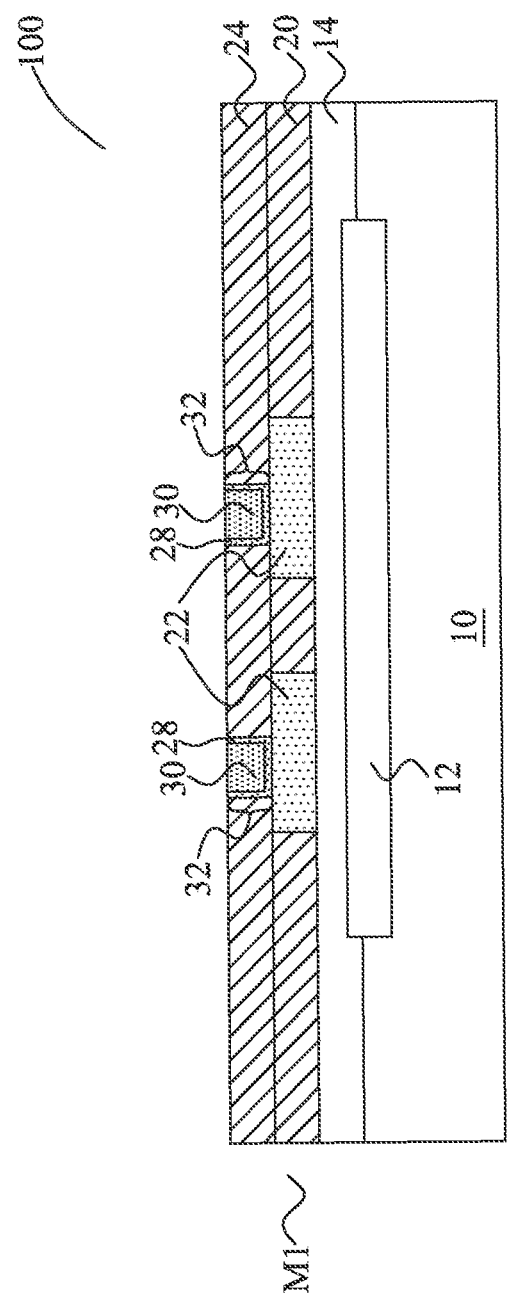

A single damascene process is shown in FIGS. 1 and 2. In FIG. 1, via openings 26 are formed in low-k IMD layer 24 by etching IMD layer 24. In some embodiments, an etch stop layer (not shown) is formed under IMD layer 24 and over IMD layer 20, wherein the etch stop layer may include a nitride, a silicon and carbon based dielectric, a carbon-doped oxide, or the like.

FIG. 2 illustrates the filling of via openings 26 in order to form vias 32. In some embodiments, diffusion barrier layer 28 is formed first, which is a blanket layer including portions in via openings 26 and portions over IMD layer 24. A seed layer (not shown, merged with copper-containing material 30) is then formed over diffusion barrier layer 28, followed by a plating step to form copper-containing material 30, until the top surface of copper-containing material 30 is higher than the top surface of low-k IMD layer 24. Diffusion barrier layer 28 may include titanium, titanium nitride, tantalum, tantalum nitride, or other alternatives. Copper-containing material 30 may comprise over 90 atomic percent, over 95 atomic percent, or over 99 atomic percent copper in some exemplary embodiments. Next, a Chemical Mechanical Polish (CMP) is performed to remove the excess portions of copper-containing material 30 and diffusion barrier layer 28 that are over low-k IMD layer 24, leaving vias 32 in IMD layer 24.

Figure 3:
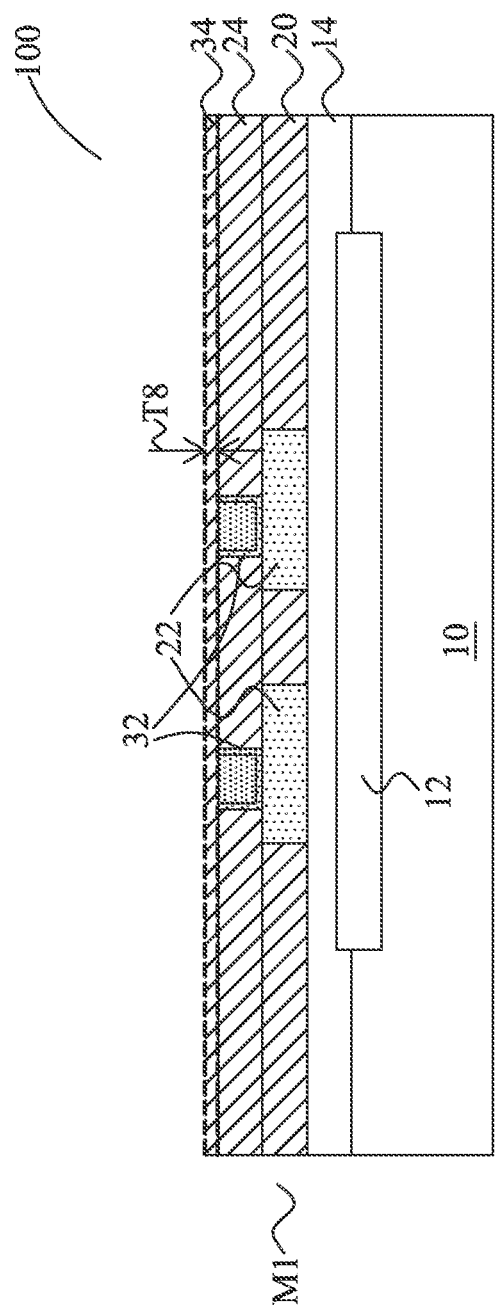
Figure 4:
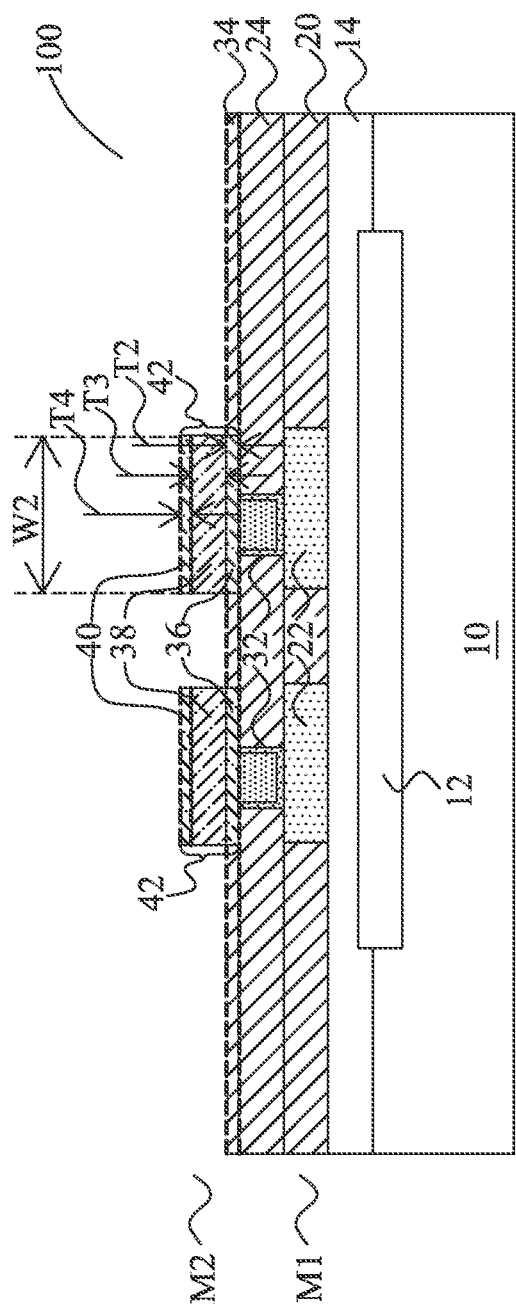

Next, as shown in FIG. 3, ESL 34, which may be formed of silicon nitride, silicon carbide, or the like, is formed over IMD layer 24 and vias 32. In alternative embodiments, no ESL 34 is formed. ESL 34 may have thickness T8 between about 2 nm and about 20 nm, for example. Next, referring to FIG. 4, a conductive layer stack, which includes conductive barrier 36 and aluminum-containing layer 38, is formed in a deposition-and-patterning process. In some embodiments, conductive barrier layer 40 is further formed on aluminum-containing layer 38. In alternative embodiments, conductive barrier layer

40 is not formed. Conductive barrier layers 36 and 40 (if any) may include titanium, titanium nitride, tantalum, tantalum nitride, or other alternatives. Aluminum-containing layer 38 may comprise over 90 atomic percent, over 95 atomic percent, or over 99 atomic percent aluminum in some exemplary embodiments. The stacked layers are then patterned to form metal lines 42, which are electrically coupled to (and may be in contact with) the respective underlying vias 32. Since layers 36, 38, and 40 are patterned using a same lithography mask, layers 36, 38, and 40 are co-terminus, with the corresponding edges of layers 36, 38, and 40 aligned to each other. Throughout the description, metal lines 42 are collectively referred to metal layer M2. In the patterning step, ESL 34 and/or conductive barrier 36 may be used as etch stop layers. Throughout the description, vias 32 and the overlying metal lines 42, whose formation is a hybrid process including a single damascene process and a deposition-and-patterning process, are in combination referred to as a hybrid structure. Conductive barrier 36 may have thickness T2 between about 1 nm and about 20 nm. Aluminum-containing layer 38 may have thickness T3 between about 10 nm and about 50 nm. Conductive barrier layer 40 may have thickness T4 between about 1 nm and about 20 nm. Metal lines 42 may have width W2 between about 8 nm and about 30 nm, for example.

Figure 5:
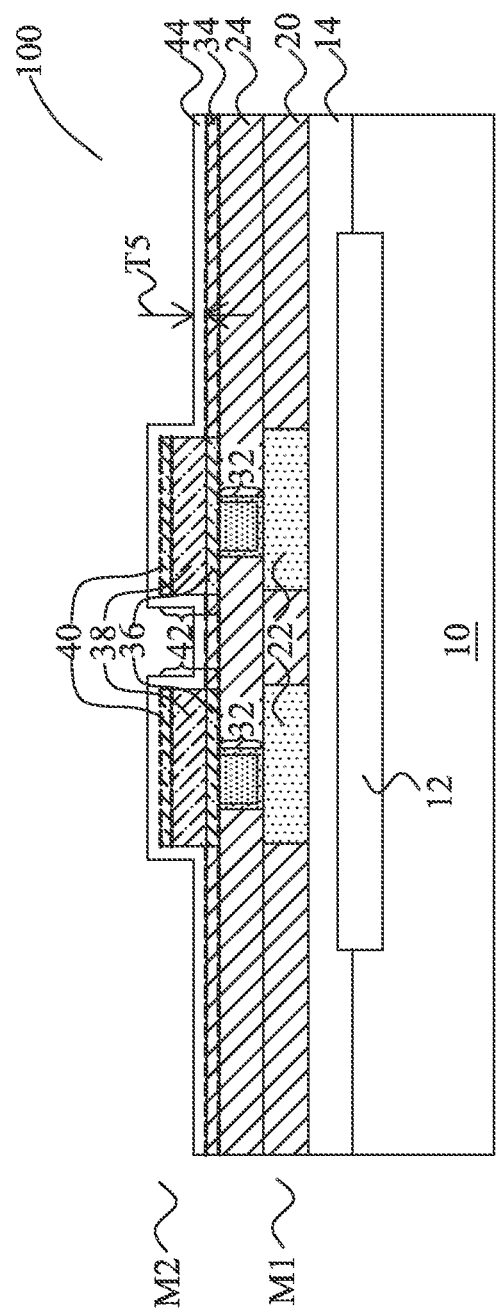

FIG. 5 illustrates the formation of dielectric barrier 44, which comprises sidewall portions on the sidewalls of metal lines 42, top portions overlapping metal lines 42, and lower portions on ESL 34. Dielectric barrier 44 may have thickness T5 between about 1 nm and about 20 nm. In the embodiments wherein no conductive barrier layer 40 is formed, the top portions of dielectric barrier 44 contact the top surfaces of aluminum-containing layers 38 in metal lines 42. Otherwise, if conductive barrier layer 40 is formed, the top portions of dielectric barrier 44 contact the top surfaces of conductive barrier layer 40 in metal lines 42. Dielectric barrier 44 may be formed of AlOx, AlNx, SiCN, SiN, or the like, wherein "x" has a value between 0 and 1. Dielectric barrier 44 may be formed using, for example, Atomic Layer Deposition (ALD).

Figure 6:
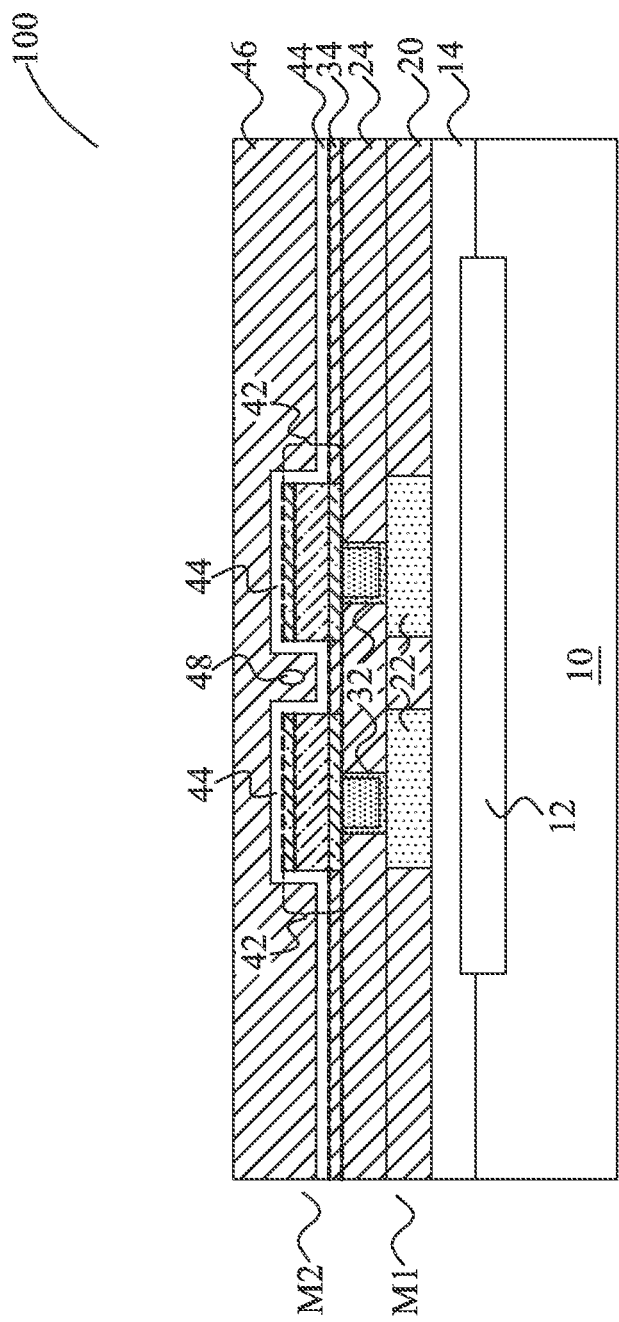

FIG. 6 illustrates the formation of IMD layer 46. The material of IMD layer 46 may be selected from the same group of available materials for forming IMD layer 24 and/or IMD layer 20. In some embodiments, IMD layer 46 is formed using a Spin-On Dielectric (SOD), which has a low k value. In alternative embodiments, IMD layer 46 may be formed using a Chemical Vapor Deposition (CVD) method such as PECVD, LPCVD, ALCVD, or the like. As a result of the CVD method, void 48 may be formed in IMD layer 46 and between neighboring void 48 may reduce the effective k value of IM layer 46, and reduce the parasitic capacitance between metal lines 42. In the embodiments wherein the CVD method is used for forming IMD layer 46, a CMP or grinding may be performed to level the top surface of IMD layer 46. In the embodiments wherein the SOD is used for forming IMD layer 46, the CMP or the grinding step may be performed, or may be omitted. In The top surface of IMD layer 46 is higher than the top surface of metal lines 42 and the top portions of dielectric barrier layer 44.

Figure 7:
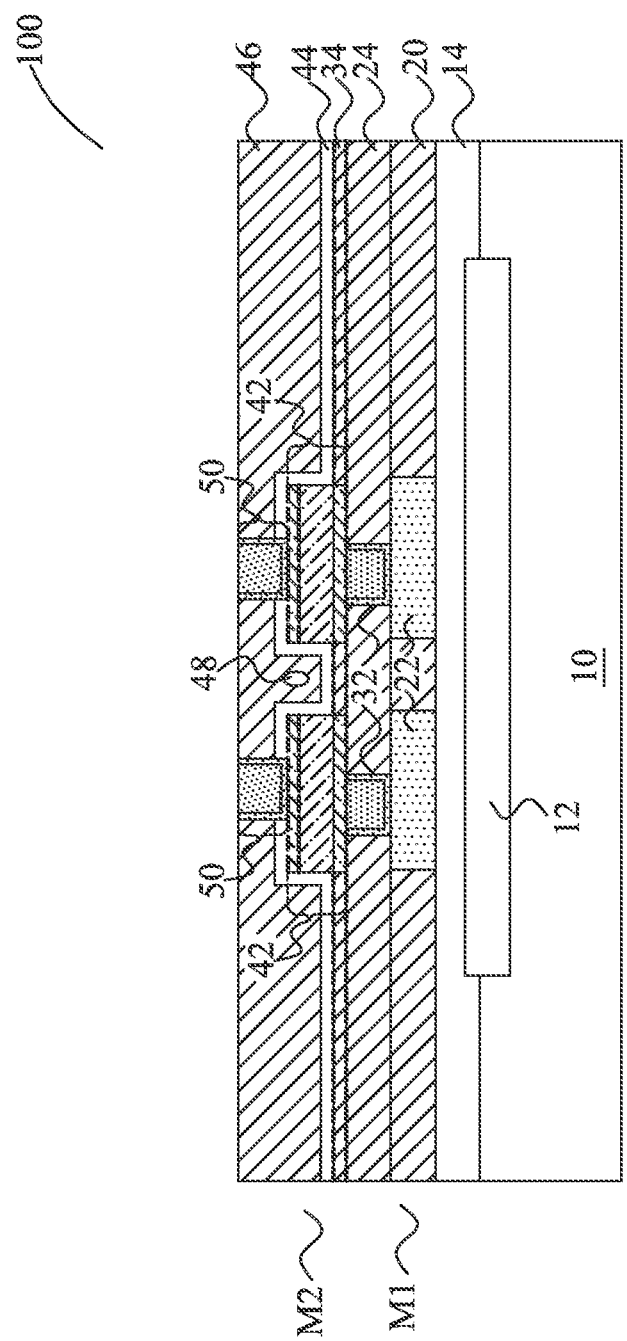
Figure 8:
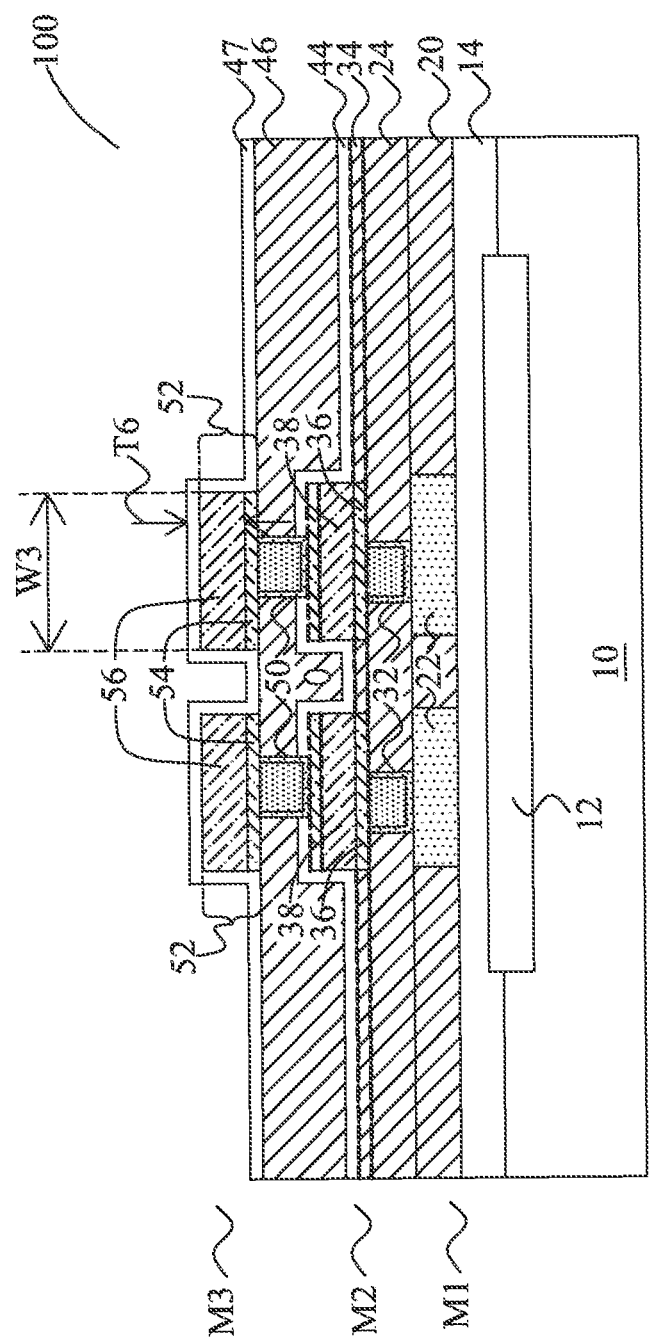

In FIG. 7, vias 50 are formed using a single damascene process, wherein the formation may be essentially the same as shown in FIGS. 1 and 5. Vias 50 are formed in IMD layer 46, and are electrically coupled to underlying metal lines 42. Vias 50 penetrate through dielectric layer 44 to electrically couple to metal lines 42. In a subsequent step, as shown in FIG. 8, metal lines 52 are formed, wherein the formation process may be essentially the same as the formation of metal lines 42. Dielectric barrier layer 47 may then be formed, for example, with a similar material and a similar thickness as dielectric barrier layer 44. Metal lines 52 are collectively referred to as metal layer M3. Each of metal lines 52 includes conductive barrier layer 54 and aluminum-containing layer 56 over conductive barrier layer 54. Aluminum-containing layer 56 may have thickness T6 between about 10 nm and about 50 nm, and width W3 between about 8 nm and about 30 nm, for example. Conductive barrier layer 54 and aluminum-containing layer 56 may be formed using essentially the same method and same materials as conductive barrier layer 36 and aluminum-containing layer 38, respectively. In the illustrated embodiments, no ESL is formed over IMD layer 46 and underlying dielectric layer 47, although an ESL (not shown) may be formed, wherein the ESL may be formed using similar material and similar thickness as ESL 34. Furthermore, no conductive barrier layer is formed in the illustrated embodiments, although a conductive barrier layer similar to conductive barrier layer 40 may also be formed over and adjoining aluminum-containing layer 56.

Figure 9:
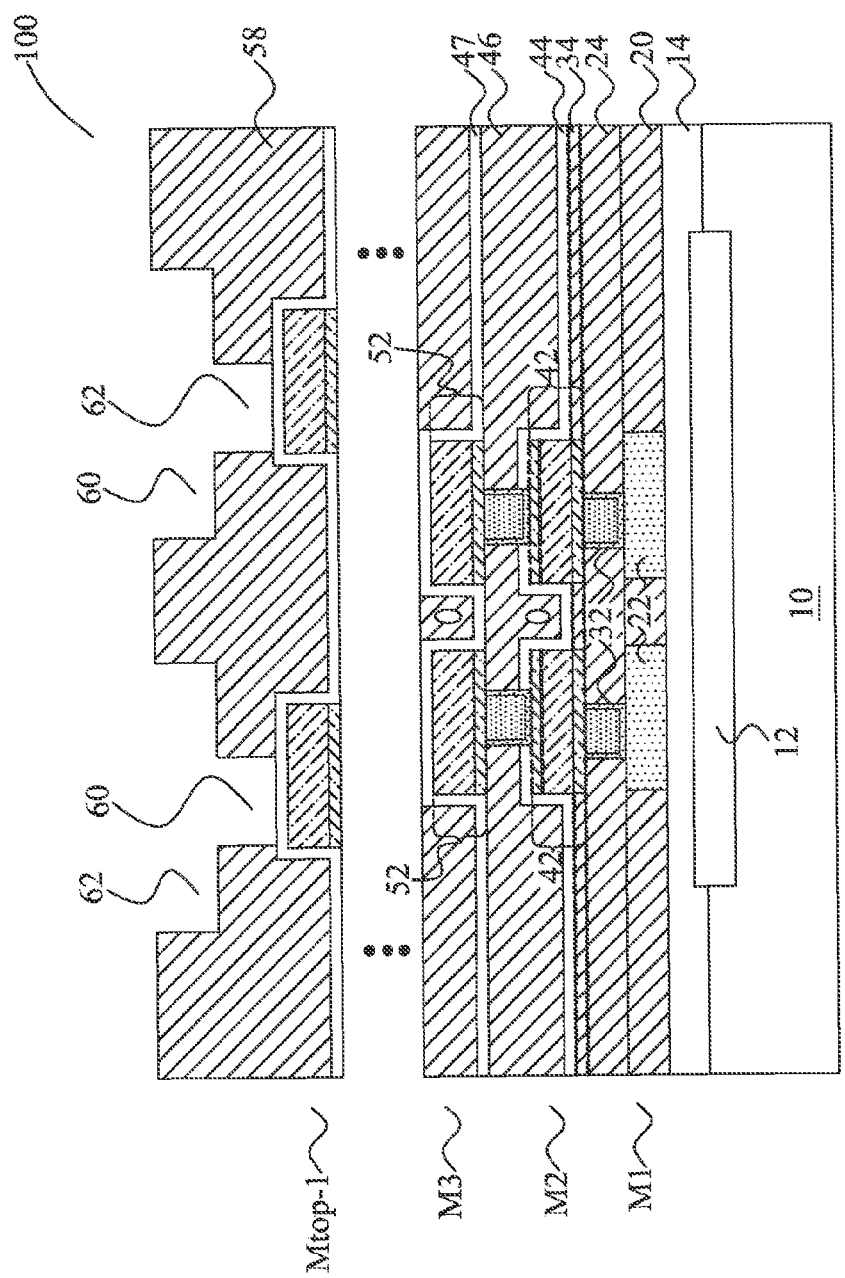
Figure 10:
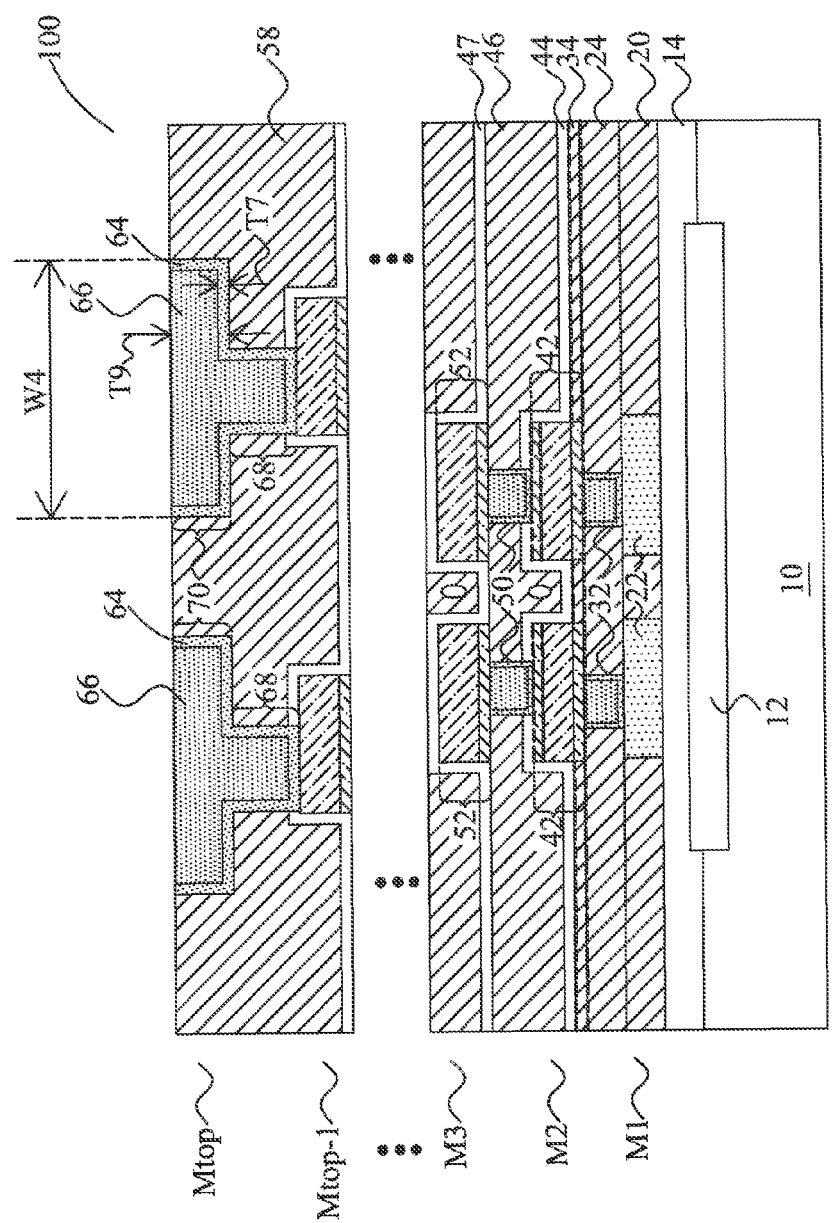

FIGS. 9 and 10 illustrate the formation of the rest of low-k dielectric layers up to the top metal layer Mtop (please refer to FIG. 10), which is the topmost metal layer that is formed in a low-k dielectric layer. The sign "top" in the term "Mtop" represents an integer, which may be any integer between about 3 and about 10, for example. Accordingly, the metal layer under metal layer Mtop is referred to as metal layer Mtop−1. In some embodiments, each of metal layers M2 through Mtop and the respective underlying vias has the hybrid structure. The hybrid structure includes vias formed using a single damascene process, and aluminum-containing metal lines over and contacting the vias, with the aluminum-containing metal lines formed using deposition and patterning, rather than the single damascene or the dual damascene process. In alternative embodiments, each of lower metal layers M2 through Mn (not shown) and the respective underlying vias forms the hybrid structures, while each of upper metal layers M(n+1) (not shown) through Mtop is formed using dual damascene processes, wherein integer n may be any integer between, and including, 2 and (top−1). For example, FIGS. 9 and 10 schematically illustrates a dual damascene process for forming the upper metal layers.

Referring to FIG. 9, IMD layer 58, which is a low-k dielectric layer, is formed. Next, via openings 60 and trenches 62 are formed in IMD layer 58 using etching processes. Next, as shown in FIG. 10, via openings 60 and trenches 62 are filled, followed by a CMP process. The filling material may include conductive barrier layer 64 and conductive material 66 over conductive barrier layer 64. Conductive barrier layer 64 may be formed of titanium, titanium nitride, tantalum, tantalum nitride, or the like. Thickness T7 of conductive barrier layer 64 may be between about 5 nm and about 50 nm, for example. Conductive material 66 may comprise copper or a copper alloy. As a result of the filling step and the CMP step, vias 68 and metal lines 70 are formed in via openings 60 and trenches 62, respectively. Metal lines 70 may have thickness T9 between about 100 nm and about 5,000 nm, and width W4 between about 50 nm and about 5,000 nm, for example.

Figure 11:
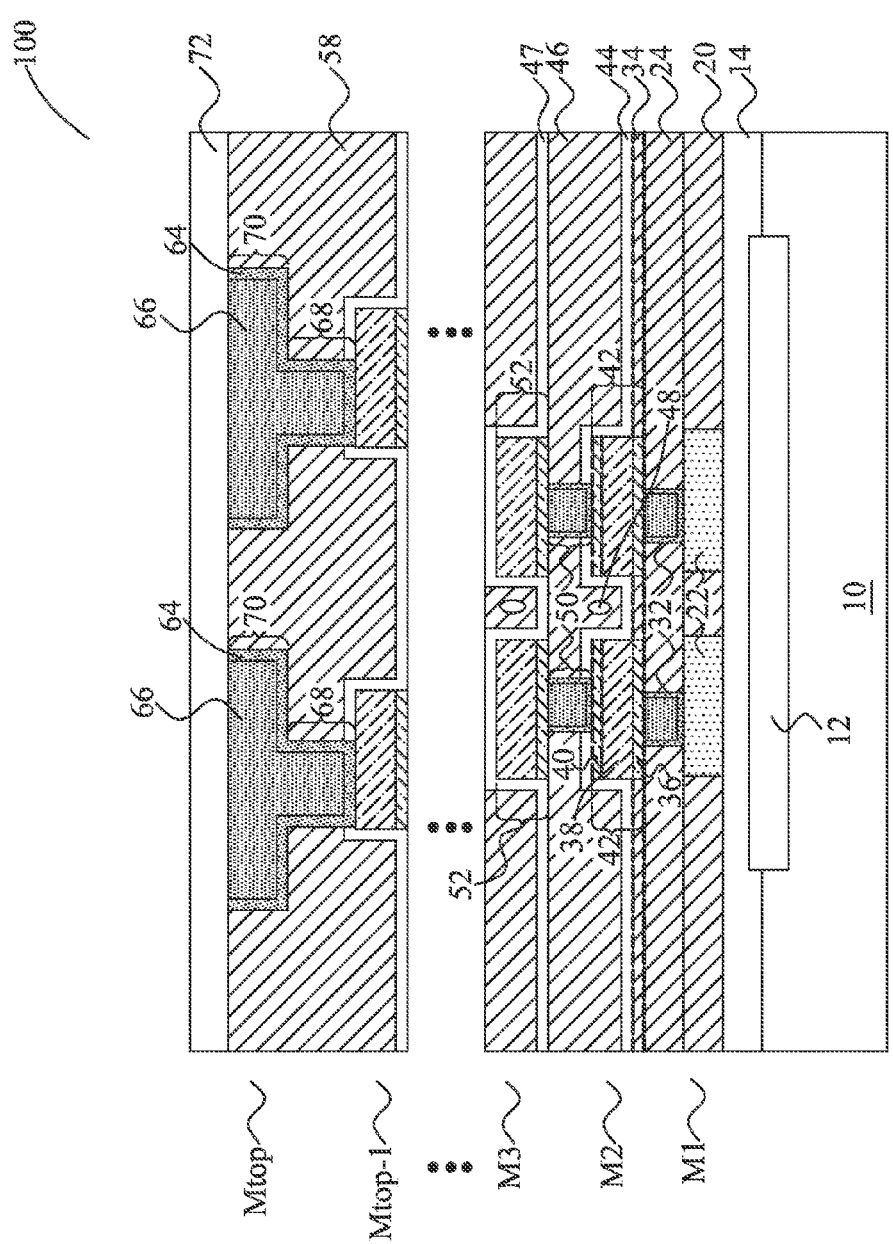

FIG. 11 illustrate the formation of non-low-k dielectric layers 72, which may be formed of silicon oxide, silicon nitride, un-doped silicate glass, or the like. Metal routing (not shown) may be formed in non-low-k dielectric layers 72, and electrically coupled to the underlying metal layers M1 through Mtop.

In the embodiments, the metal lines in the interconnect structure may include aluminum-containing metal lines. Aluminum-containing lines that are formed mainly of aluminum, when having line widths between about 40 nm and about 50 nm or smaller, may have a line resistivity smaller than that of copper lines having the same widths. Furthermore, with the further reduction of the line widths of the aluminum lines, the difference between the line resistivity of the aluminum lines and the line resistivity of the copper lines (having the same widths), is increasingly higher with the increasingly reduction of the line widths. Accordingly, adopting aluminum lines when the line widths are small may result in reduced line resistivity and reduced RC delay. On the other hand, when aluminum lines are formed through deposition and patterning, the underlying vias are formed using single damascene processes, rather than dual damascene processes. Accordingly, the gap filling into the via openings is easier than the gap filling of both the trenches and the vias openings in dual damascene processes.

Furthermore, the upper metal layers such as metal layer Mtop may have greater line width than the underlying metal layers. Accordingly, the upper metal layers may adopt dual damascene processes, with the metal lines in the upper metal layers comprising copper lines, while the lower metal layers may adopt the hybrid structures. Accordingly, the line resistivity values of the upper metal layers and the lower metal layers are optimized.

In accordance with embodiments, a device includes a first low-k dielectric layer, and a copper-containing via in the first low-k dielectric layer. The device further includes a second low-k dielectric layer over the first low-k dielectric layer, and an aluminum-containing metal line over and electrically coupled to the copper-containing via. The aluminum-containing metal line is in the second low-k dielectric layer.

In accordance with other embodiments, a device includes a first low-k dielectric layer, a first copper-containing via in the first low-k dielectric layer, a second low-k dielectric layer over the first low-k dielectric layer, and a conductive line in the second low-k dielectric layer and electrically coupled to the first copper-containing via. The conductive line includes a conductive barrier layer, and an aluminum-containing metal line over the conductive barrier layer. A dielectric barrier layer includes first portions on sidewalls of the aluminum-containing metal line, a second portion overlapping the aluminum-containing metal line, and a third portion underlying the second low-k dielectric layer.

In accordance with yet other embodiments, a method includes forming a first via in a first low-k dielectric layer using a single damascene process, depositing an aluminum-containing layer over the first via, and patterning the aluminum-containing layer to form an aluminum-containing line. The aluminum-containing line is electrically coupled to the first via. A second low-k dielectric layer is formed over the first low-k dielectric layer, wherein the aluminum-containing line is in the second low-k dielectric layer.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
    a first low-k dielectric layer;
    a copper-containing via in the first low-k dielectric layer;
    a second low-k dielectric layer over the first low-k dielectric layer; and
    an aluminum-containing metal line over and electrically coupled to the copper-containing via, wherein the aluminum-containing metal line is in the second low-k dielectric layer.

2. The device of claim 1 further comprising a conductive barrier layer, wherein the conductive barrier layer comprises:
    a bottom portion underlying the copper-containing via; and
    sidewall portions on sidewalls of the copper-containing via.

3. The device of claim 2, wherein the conductive barrier layer is a non-copper-containing layer.

4. The device of claim 1 further comprising a non-aluminum-containing conductive barrier layer between the aluminum-containing metal line and the copper-containing via, wherein the non-aluminum-containing conductive barrier layer and the aluminum-containing metal line are co-terminus.

5. The device of claim 1 further comprising a dielectric barrier layer comprising:
    first portions on sidewalls of the aluminum-containing metal line; and
    a second portion overlapping the aluminum-containing metal line.

6. The device of claim 5, wherein the second portion of the dielectric barrier layer comprises a bottom surface contacting a top surface of the aluminum-containing metal line.

7. The device of claim 5 further comprising a non-aluminum-containing conductive barrier layer over and contacting the aluminum-containing metal line, wherein the second portion of the dielectric barrier layer comprises a bottom surface contacting a top surface of the additional non-aluminum-containing conductive barrier layer.

8. The device of claim 1 further comprising:
    a third low-k dielectric layer over the second low-k dielectric layer; and
    a metal line and a via in the third low-k dielectric layer, wherein the metal line and the via form a dual damascene structure.

9. A device comprising:
    a first low-k dielectric layer;
    a first copper-containing via in the first low-k dielectric layer;
    a second low-k dielectric layer over the first low-k dielectric layer; and
    a first conductive line in the second low-k dielectric layer and electrically coupled to the first copper-containing via, wherein the first conductive line comprises:
        a first conductive barrier layer; and
        a first aluminum-containing metal line over the first conductive barrier layer; and
    a dielectric barrier layer comprising:
        first portions on sidewalls of the first aluminum-containing metal line;
        a second portion overlapping the first aluminum-containing metal line; and
        a third portion underlying the second low-k dielectric layer.

10. The device of claim 9 further comprising a plurality of metal layers over the second low-k dielectric layer, wherein all metal layers over the second low-k dielectric layer and in low-k dielectric layers form dual damascene structures along with respective underlying vias.

11. The device of claim 9 further comprising:
a third low-k dielectric layer underlying the first low-k dielectric layer;
a second copper-containing via in the third low-k dielectric layer, wherein the second copper-containing via has a single damascene structure;
a fourth low-k dielectric layer under the first low-k dielectric layer and underlying the third low-k dielectric layer; and
a second conductive line in the fourth low-k dielectric layer, wherein the second conductive line comprises:
a second conductive barrier layer; and
a second aluminum-containing metal line over the second conductive barrier layer.

12. The device of claim 9, wherein the dielectric barrier layer comprises a bottom surface contacting a top surface of the first low-k dielectric layer.

13. The device of claim 9 further comprising an etch stop layer between the first and the second low-k dielectric layers, wherein the dielectric barrier layer comprises:
a bottom surface contacting a top surface of the etch stop layer; and
a top surface contacting a bottom surface of the second low-k dielectric layer.

14. The device of claim 9, wherein edges of the first conductive barrier layer are aligned to respective edges of the first aluminum-containing metal line.

15. A device comprising:
a first low-k dielectric layer;
a copper-containing via in the first low-k dielectric layer;
a second low-k dielectric layer over the first low-k dielectric layer;
an aluminum-containing metal line over and electrically coupled to the copper-containing via, wherein the aluminum-containing metal line is in the second low-k dielectric layer;
a third low-k dielectric layer over the second low-k dielectric layer; and
a metal line and a via in the third low-k dielectric layer, wherein the metal line and the via form a dual damascene structure comprising copper.

16. The device of claim 15 further comprising a conductive barrier layer, wherein the conductive barrier layer is a non-copper-containing layer, and wherein the conductive barrier layer comprises:
a bottom portion underlying the copper-containing via; and
sidewall portions on sidewalls of the copper-containing via.

17. The device of claim 15 further comprising a non-aluminum-containing conductive barrier layer between the aluminum-containing metal line and the copper-containing via, wherein the non-aluminum-containing conductive barrier layer and the aluminum-containing metal line are co-terminus.

18. The device of claim 15 further comprising a dielectric barrier layer comprising:
first portions on sidewalls of the aluminum-containing metal line; and
a second portion overlapping the aluminum-containing metal line, wherein the second portion of the dielectric barrier layer comprises a bottom surface contacting a top surface of the aluminum-containing metal line.

19. The device of claim 18 further comprising an additional non-aluminum-containing conductive barrier layer over and contacting the aluminum-containing metal line, wherein the second portion of the dielectric barrier layer comprises a bottom surface contacting a top surface of the additional non-aluminum-containing conductive barrier layer.

20. The device of claim 15, wherein the aluminum-containing metal line has a line width smaller than about 50 μm.

* * * * *